(12) United States Patent
Noda

(10) Patent No.: US 6,512,299 B1
(45) Date of Patent: *Jan. 28, 2003

(54) SEMICONDUCTOR DEVICE AND A MANUFACTURING PROCESS THEREFOR

(75) Inventor: Kenji Noda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/149,273

(22) Filed: Sep. 9, 1998

(30) Foreign Application Priority Data

Sep. 10, 1997 (JP) .............................................. 9-245387
Jul. 31, 1998 (JP) ............................................ 10-218034

(51) Int. Cl.[7] .............................................. H01L 23/48
(52) U.S. Cl. ........................ 257/774; 257/408; 257/754; 257/755; 257/768; 257/769; 257/775
(58) Field of Search ................................ 257/408, 288, 257/265, 768, 769, 774, 775, 755, 754; 438/190, 230

(56) References Cited

U.S. PATENT DOCUMENTS

| | | | | |
|---|---|---|---|---|
| 5,094,981 A | * | 3/1992 | Chung et al. | ............... 437/190 |
| 5,612,239 A | | 3/1997 | Lin et al. | |
| 5,621,232 A | * | 4/1997 | Ohno | .......................... 257/288 |
| 5,824,579 A | * | 10/1998 | Subramanian et al. | ....... 438/238 |
| 5,885,871 A | * | 3/1999 | Chan et al. | ................. 438/265 |
| 5,952,693 A | * | 9/1999 | Wu et al. | .................... 257/344 |
| 6,107,096 A | * | 8/2000 | Mikagi | ........................ 438/586 |

FOREIGN PATENT DOCUMENTS

| | | | | |
|---|---|---|---|---|
| JP | 63-313855 | | 12/1988 | |
| JP | 404037167 A | * | 2/1992 | ................. 257/408 |
| JP | 5-226590 | | 9/1993 | |
| JP | 406029310 A | * | 2/1994 | ................. 257/408 |
| JP | 6-204246 | | 7/1994 | |
| JP | 7-106570 | | 4/1995 | |
| JP | 7-122737 | | 5/1995 | |

\* cited by examiner

Primary Examiner—Eddie Lee
Assistant Examiner—Matthew E. Warren
(74) Attorney, Agent, or Firm—Sughrue Mion, PLLC

(57) ABSTRACT

This invention provides a semiconductor device comprising gate insulating films 13, 21 formed on the main surface of a silicon substrate 11; gate electrodes 14, 22 consisting of polycrystalline silicon; and a high-density doped layer 17, wherein a part of the side of the gate electrode 22 is electrically connected with the high-density doped layer via a metal silicide layer 23.

2 Claims, 17 Drawing Sheets

SEMICONDUCTOR DEVICE AND A MANUFACTURING PROCESS THEREFOR

BACKGROUND OF THE INVENTION

1. Field of the Invention

This invention relates to a semiconductor device and a manufacturing process thereof. In particular, it relates to a technique for connecting a gate electrode and a doped layer.

2. Description of the Related Art

A semiconductor device having a common contact for connecting both an electrode, such as gate electrode, and a doped layer has been conventionally formed as shown in the schematic sectional view of FIG. 11. Specifically, a gate electrode 204a consisting of polycrystalline silicon for forming a transistor via a gate oxide film 203a is formed on a surface of a silicon substrate 201 on which a device-isolation region 202 has been formed by a LOCOS or trench isolation technique, and spacers 205 consisting of silicon dioxide, are formed on the sides of the gate electrode 204a. On the substrate surface, a low-density doped layer 206 and a high-density doped layer 207(a,b) constituting an LDD transistor are formed in the region defined by the gate electrode 204a and the spacers 205. A titanium silicide layer 208 for minimizing resistance is formed on the surfaces of the high-density doped layer 207 and the gate electrode 204. These constitute a N-type MOSFET (209). A wiring electrode 204b made of the same material as that of the gate electrode 204a is formed, via a gate oxide film 203b, on the silicon substrate 201 and the device-isolation region 202, for ensuring their electrical connection with the high-density doped layer 207b as a drain node for MOSFET (209). An interlayer insulating film 213 is formed on the wires and the transistor, and a common contact 214, in which a contact plug made of polysilicon or tungsten is buried, is formed, covering both the surface of the high-density doped layer 207b as a drain node and the electrode 204b. The common contact 214 is, if necessary, connected with wires in upper layers.

In this structure, the common contact 214 is electrically connected with the high-density doped layer 207b to be a drain node and the electrode 204b, covering a spacer 205. There has been, therefore, a problem that the size of the contact is reduced, the contact resistance increases. JP-A 4-63436 has disclosed an approach for solving this problem.

The approach is that the spacer 205, which has been formed on the portion to be connected with the common contact 214, is removed before forming the contact, to avoid an increase of the contact resistance by reduction of the contact size. The manufacturing process will be described with reference to the sectional process charts of FIGS. 12(a) to 12(e).

A gate electrode 204, consisting of polycrystalline silicon for forming a transistor via a gate oxide film 203, is formed on a surface of a silicon substrate 201 on which a device-isolation region 202 has been formed by a LOCOS or trench isolation technique. A low-density doped layer 206, constituting an LDD transistor is formed by, e.g., ion implantation. Then, spacers 205 consisting of silicon dioxide are formed on the sides of the gate electrodes 204 (FIG. 12(a)). On the substrate surface, high-density doped layers 207a, b are formed in the region defined by the gate electrodes 204 and the spacers 205 by ion implantation, and titanium silicide layers 208 for reduction of resistance are formed on the surfaces of the high-density doped layers 207 and the gate electrodes 204 (FIG. 12(b)). A resist 210 is deposited on the substrate surface. After patterning, an opening 211 is formed for removing the spacer, which exists, in a portion where a contact plug is to be buried. Then, the spacer 205, exposed in the opening 211, is removed (FIG. 12(c)).

After removing the resist, an interlayer insulating layer 212, consisting of an oxide film and a BPSG film, is formed, and a common contact hole 213 is formed using a resist mask (FIG. 12(d)).

A barrier film 215 with a laminated structure of Ti and TiN is formed in the common contact hole 213 by, e.g., spattering, and then a metal material 216, such as tungsten, is buried to form a common contact 214 (FIG. 12(e)).

In the prior art, shown in FIG. 12e, there has been, however, a problem that since the barrier film 215 is formed on the low-density doped layer 206, current leak may occur between the common contact 214 and the substrate 201.

To avoid the current leak, it is necessary to conduct some procedure such as implanting an impurity of the same conduction type as that of the high-density doped layer 207 after forming the contact hole 213. Specifically, for achieving a CMOS structure, there should be added two lithography steps, i.e., one for an NMOS and one for a PMOS.

Further, when a contact is formed in a region where silicon is exposed, the resistance becomes about ten times that for a device having an aspect ratio of about 3 of the contact, even if an impurity is introduced with high density. This may be mainly due to the fact that a barrier film having an adequate thickness cannot be formed by spattering on the bottom of the contact having a large aspect ratio In addition, inadequate treatment of the silicon surface may easily lead to increasing the resistance by a couple orders og magnitude.

Since an adequately low contact resistance cannot be obtained in this portion, an offset of the common contact should be strictly controlled. Specifically, for connecting the common contact with both the doped layer and the gate electrode, an offset of R/2 for one side maybe ideally allowed, where R is the contact diameter. In the structure of the prior art, forming a spacer having a width W on a side wall of the gate may lead to decreasing the allowed width to (R-W)/2. The smaller R is, the more remarkable the influence is.

SUMMARY OF THE INVENTION

An object of this invention is to provide a technique for connecting a gate electrode with a doped layer without current leak, with a reduced number of manufacturing steps, for solving the above problems.

This invention provides a semiconductor device comprising a gate insulating film formed on a main surface of a silicon substrate having a device-isolation region, a gate electrode consisting of polycrystalline silicon, spacers for forming an LDD-MOSFET on the sides of the gate electrode, and a high-density doped layer, characterized in that the spacer which has been formed on the side wall of the gate near to and connected with the high-density doped layer, is removed at least before forming the high-density doped layer, and the gate electrode is electrically connected with the high-density doped layer via a metal silicide formed on the high-density doped layer after removing the spacer.

This invention also provides a process for manufacturing a semiconductor device comprising at least.

(1) forming a device-isolation region on a main surface of a silicon substrate, (2) forming a gate insulating film, (3) forming a gate electrode, (4) forming a spacer on a side wall of the gate electrode for manufacturing a LDD-MOSFET, (5) removing a part of the spacer on the side wall, (6) forming a high-density doped layer in a region defined by the device-isolation region and the gate electrode, and (7) forming a metal silicide layer over at least all the exposed surface of the high-density doped layer, characterized in that the side of the gate electrode on which the side wall spacer has been removed is electrically connected with the high-density doped layer via the metal silicide layer deposited in the above step (7).

In the semiconductor device and the manufacturing process therefore of this invention, a gate electrode can be automatically connected with a doped layer in a silicide step only by partially removing a spacer on the side wall of the gate electrode, leading to a minimal increase, in steps for connection. It should be noted that since all the lower surface of the silicide layer is covered with a high-density doped layer, current leak could be avoided without ion implantation after forming a contact.

Furthermore, when the silicide layer cannot be formed on the side wall of the gate electrode due to manufacturing conditions etc., a common contact hole can be formed in the portion, and the gate electrode may be electrically connected with the high-density doped layer via an implanted contact plug and on the substrate corresponding to the bottom of the contact hole there is a high-density doped layer, leading to no current leak to the substrate.

Furthermore, for an SRAM, where an extremely fine doped layer should be formed, even when the opening area for removing the side wall spacer is overlapping a part of the device-isolation region, etching of an insulating film buried in the device-isolation region may be avoided by forming the side wall spacer constituting the LDD-MOSFET as a laminated structure of an oxide film/a nitride film/an oxide film or an oxide film/a nitride film to utilize the formed nitride film as an etching stopper while removing the oxide film(s).

FIGS. .9(a) to 9(i) are sectional process charts illustrating Example 4.

Figure 7:
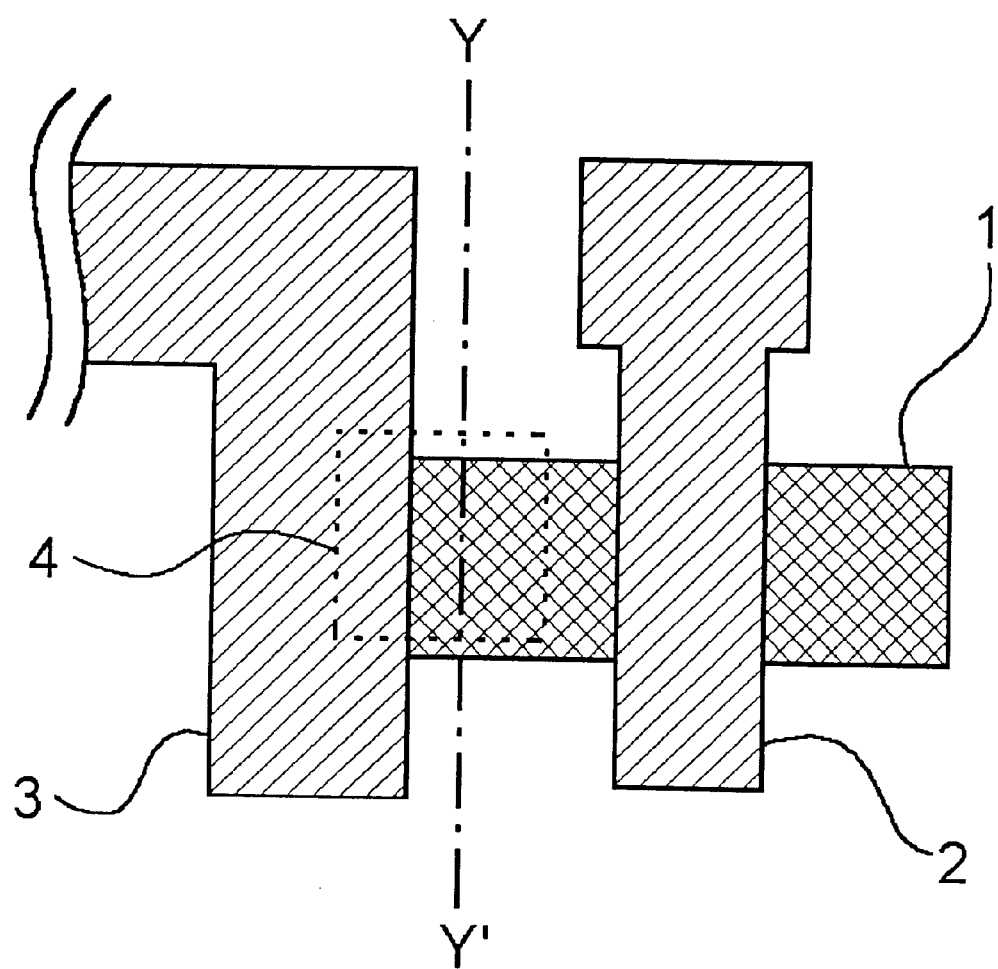
FIG. 7 is a planeview where a spacer opening includes a device-isolation region.
Figure 10:
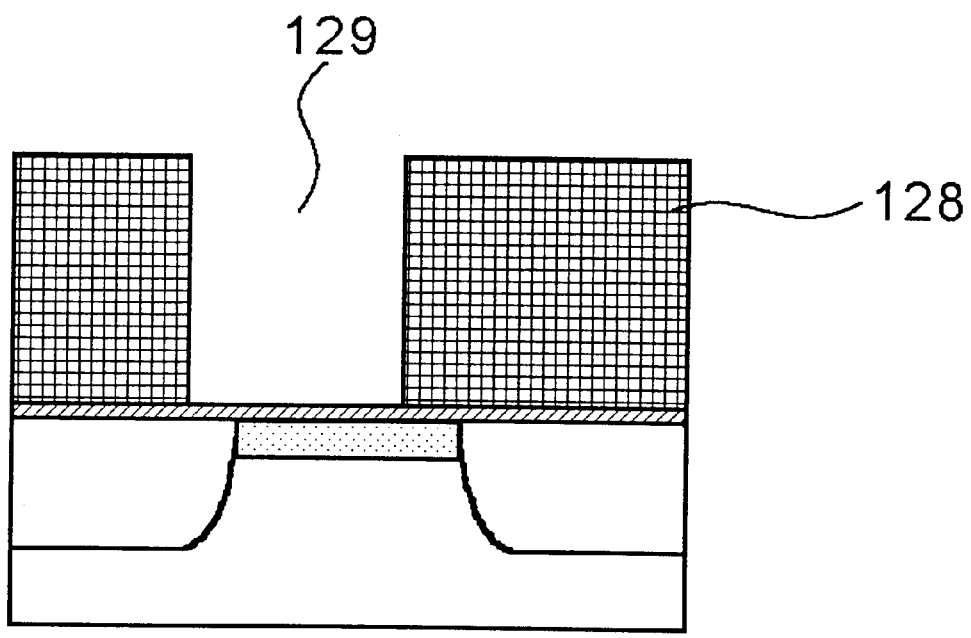

FIG. 10 is a sectional view along line Y–Y' in FIG. 7 After conducting the procedure of Example 4.

Figure 11:
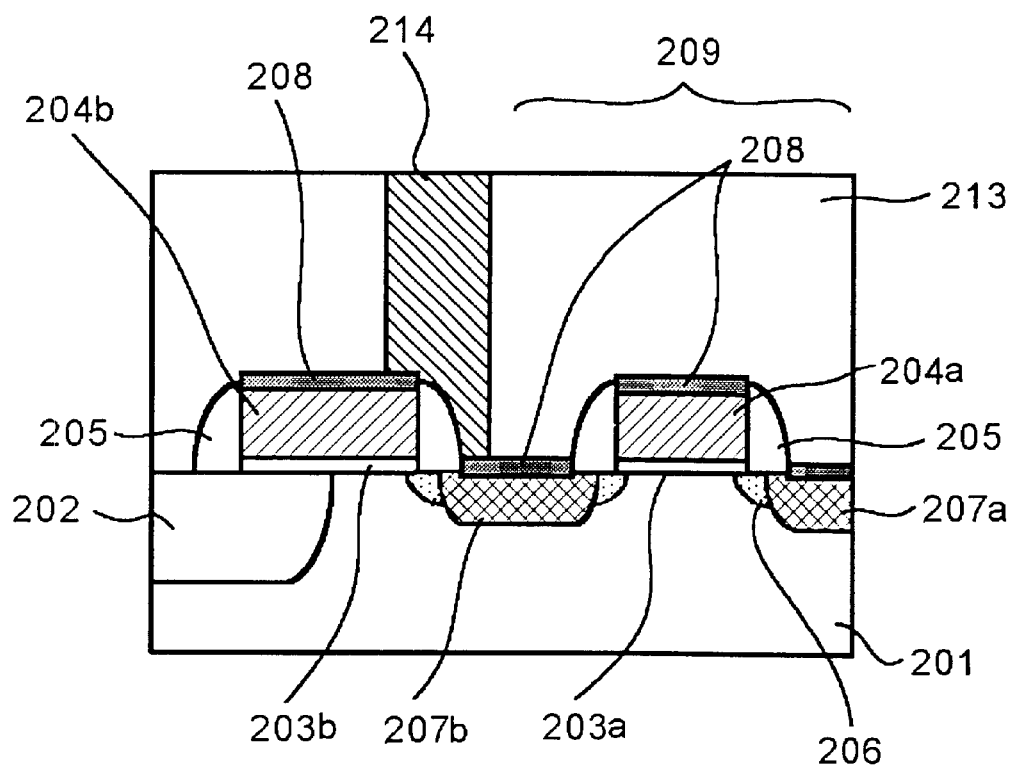
Figure 12A:
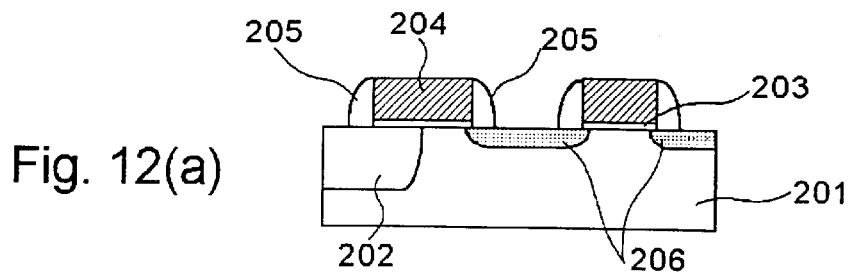
Figure 12B:
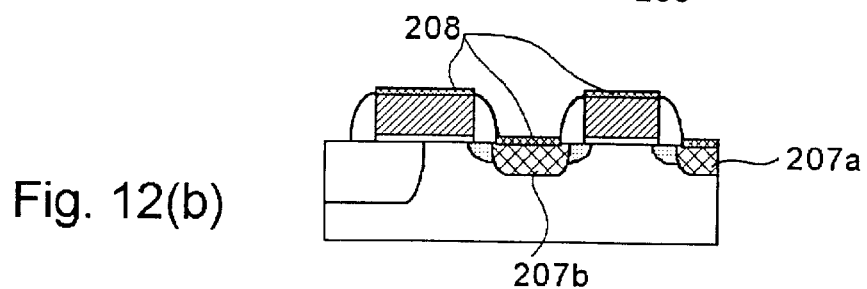
Figure 12C:
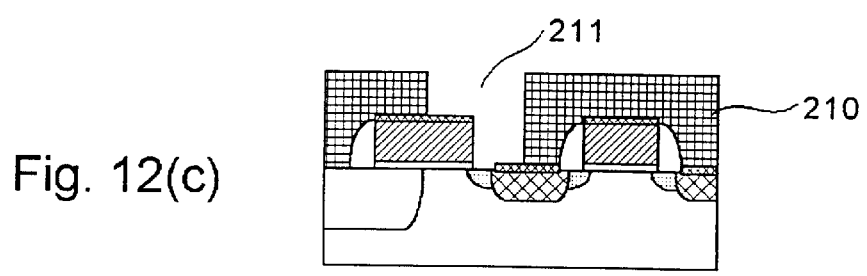
Figure 12D:
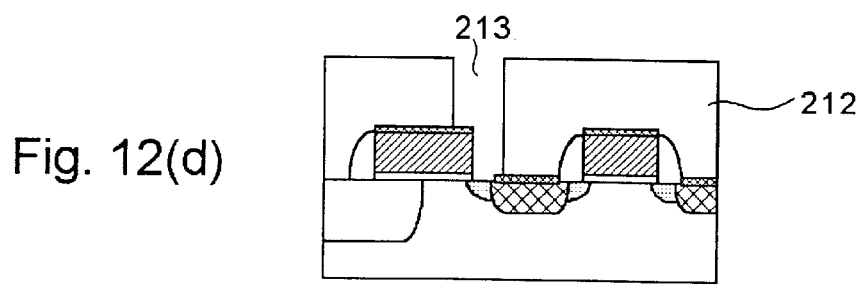
Figure 12E:
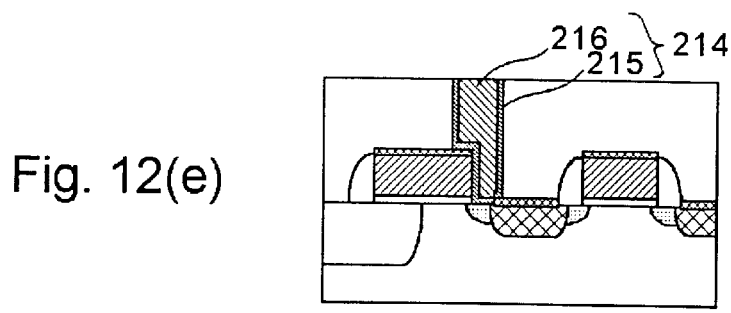

FIG. 11 is a schematic sectional view of a CMOS of the prior art.

FIGS. 12(a) to 12(e) are sectional process charts illustrating another manufacturing process of the prior art.

DETAILED DESCRIPTION OF THE PREFERRED EMBODIMENTS

The semiconductor device of this invention may be manufactured in accordance with the following principles.

When a silicide layer is formed on a doped layer and a gate electrode by a silicide technique, insulating spacers are usually formed on the sides of the gate electrode before deposition of a metal, such as titanium and cobalt, for avoiding a shortcut between the gate and the silicon substrate. In this invention, a silicide layer may be formed on the side of the gate during the silicide process by partially removing the spacer immediately after the formation thereof. When the silicide layer is sufficiently thicker than a gate oxide film under the gate electrode, the silicide films on the gate electrode and the doped layer may be connected over the gate oxide film, leading to an electrical connection between the gate electrode and the doped layer. Furthermore, after removing the spacer, ion implantation may be conducted for a high-density doped layer before forming the silicide layer, and thus the whole bottom face of the silicide on the substrate may be a high-density doped layer, resulting in an avoidance of current leak.

Depending on the manufacturing conditions, the metal silicide layer may be absent on the of the gate electrode and the doped layer, and thus these layers may not be electrically connected. In such a case, a contact plug buried in a common contact connecting both the gate electrode and the high-density doped layer with the upper wiring, as shown in FIG. 6(f), may be used to ensure an electrical connection between the gate electrode and the high-density doped layer, even if there is a gap in the metal silicide layer. This technique appears similiar to the prior art, but in this invention, the high-density doped layer is totally covered with the metal silicide layer and connected via the metal silicide layer in all of the area where the contact plug is in contact with the silicon substrate, e.g., to improve an offset allowance in the lithography of the contact. Furthermore, since the high-density doped layer is formed in the area where the contact plug is in contact with the silicon substrate, current leak to the substrate may be avoided. Since the metal silicide film has already been formed in the area corresponding to the bottom of the contact, resistance may be adequately minimized even when a contact is opened with a high aspect ratio.

This invention will be detailed by, but not limited to, examples with reference to the drawings.

EXAMPLE 1

Figure 1:
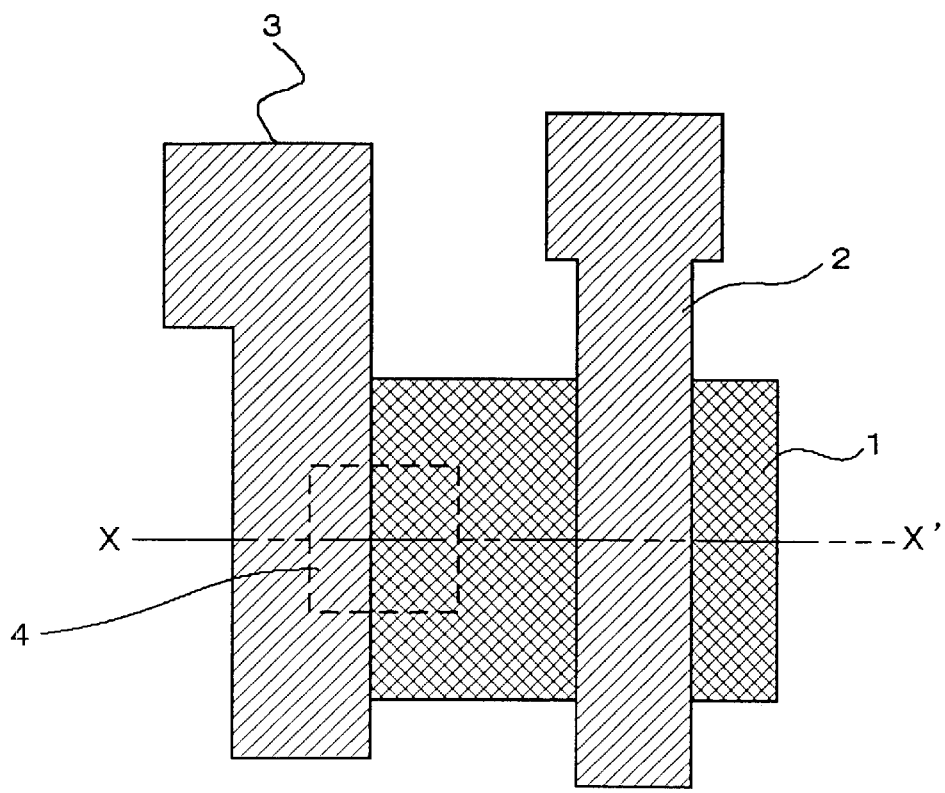
FIG. 1 is a plane view showing the configuration of an embodiment of the semiconductor device of this invention.

FIG. 1 is a planeview illustrating an embodiment of this invention. In active region 1, i.e., an exposed face of a high-density doped layer, and a gate electrode 2 extending across the layer form a MOSFET. In the end area of the active region 1, there lies a gate electrode 3, a wiring simultaneously formed with the gate electrode 2.

Titanium silicide is formed on the surfaces of the active region 1 and of the gate electrodes 2 and 3. The active region 1 is insulated from the gate electrodes 2 and 3, respectively, with a side wall spacer consisting of a silicon dioxide film, while the gate electrode 3 is electrically connected to the active region 1 via titanium silicide in area 4 where a part of the side wall spacer has been removed.

Figure 2:
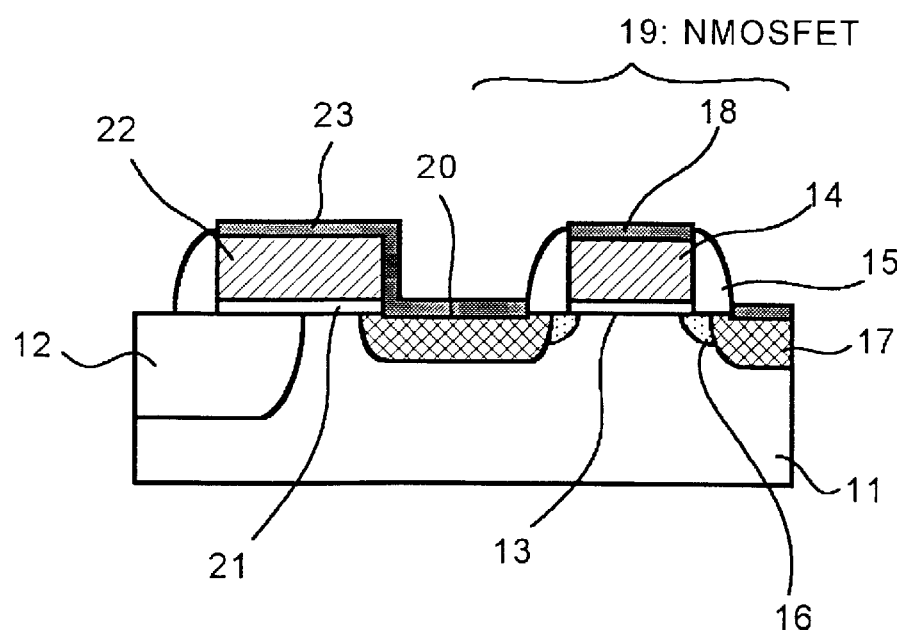
FIG. 2 is a schematic sectional view along line X–X' in FIG. 1, showing the configuration of an embodiment of the semiconductor device of this invention.

FIG. 2 is a sectional view along line X–X' in FIG. 1. A gate electrode 14 consisting of polycrystalline silicon for forming a transistor via a gate oxide film 13 is formed on the surface of a silicon substrate 11 on which a device-isolation region 12 has been formed by a LOCOS or trench isolation technique. A spacer 15 consisting of silicon dioxide ($SiO_2$) is formed on both sides of the gate electrode 14. Thus, a low-density doped layer 16 constituting an LDD transistor and a high-density doped layer 17 are formed in the region defined by the gate electrode 14 and the spacer 15. On the surfaces of the high-density doped layer 17 and the gate electrode 14, a titanium silicide layer 18 is formed for minimizing resistance. These constitute an N-type MOSFET (19). A gate electrode 22 made of the same wiring material as that of the gate electrode 14 is formed via a silicon oxide film 21 of the same material as that of the gate oxide film 13, on the silicon substrate 11 and the device-isolation region 12, for ensuring their electrical connection with a drain node 20 of the NMOSFET (19). A titanium silicide layer 23 is formed on the surface of the high-density doped layer as the drain node 20 as well as the face and the side of the electrode 22, and the drain node 20 consisting of the high-density doped layer and the gate electrode 22 are electrically connected. In the above description, titanium silicide is selected as a material of the silicide layer, but it is, of course, obvious that other suicides such as cobalt silicide or other metal silicides may be used.

A manufacturing process for achieving the above configuration will be described with reference to FIGS. 3(a) to 3(f).

Figure 3A:
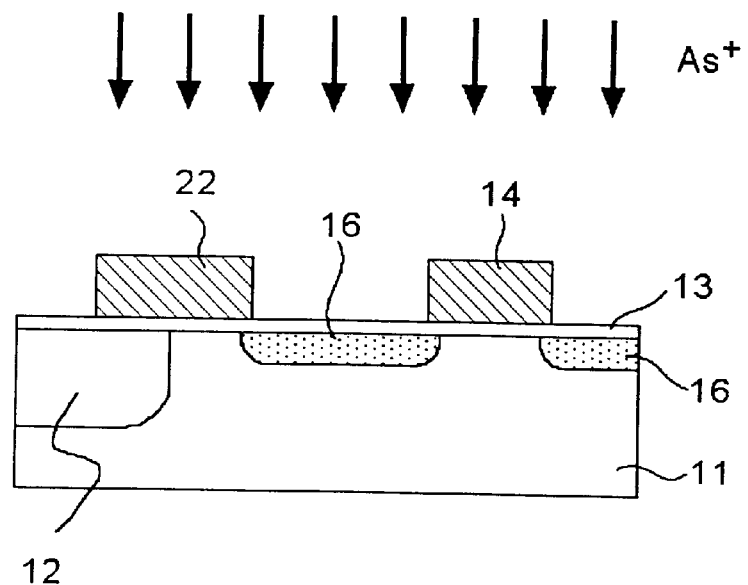
FIGS. 3(a) to 3(f) are sequential diagrams illustrating a manufacturing process of the semiconductor device in FIG. 2.

As shown in FIG. 3(a), a device-isolation region 12 is formed on a silicon substrate 11 doped with a P-type impurity by a LOCOS or trench isolation technique, in accordance with a usual manufacturing process for a MOSFET. On the surfaces of these elements, a material for a gate electrode, such as polycrystalline silicon 150 nm in thickness, is deposited via a gate oxide film 13, such as a silicon oxide film 5 nm in thickness, and it is subject to patterning in a desired shape to form gate electrodes 14 and 22. Then, the overall surface is implanted, for example, with 5E13 of arsenic atoms with an energy of 20 keV to form an LDD (low-density doped) layer 16.

Figure 3B:
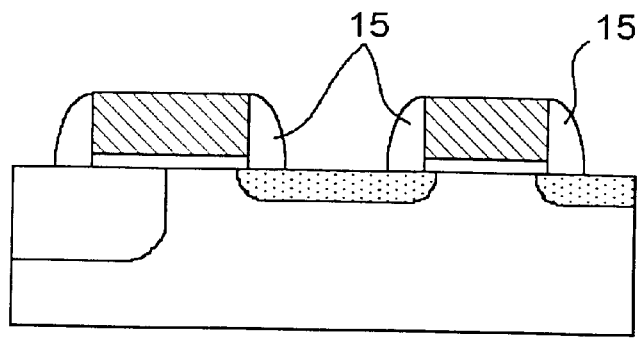

On the overall surface of the substrate on which the gate electrodes 14 and 22 have been formed is deposited a silicon oxide film about 100 nm in thickness. Then, the substrate is etched back by anisotropic dry etching to form $SiO_2$ spacers 15 on the sides of the gate electrodes 14 and 22 as shown in FIG. 3(b).

Figure 3C:
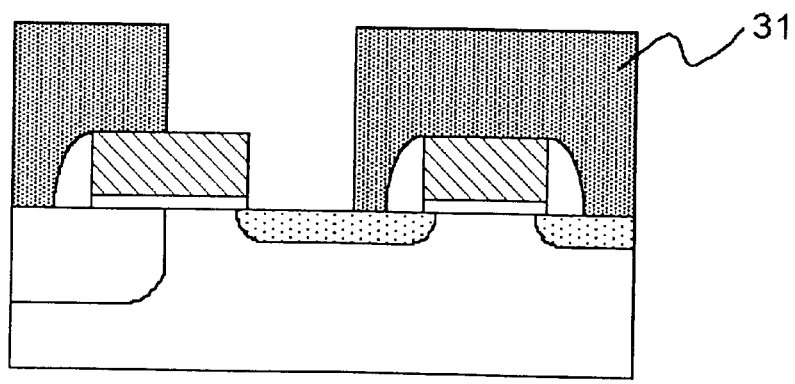

After patterning a photoresist 31 as shown in FIG. 3(c) using a mask for forming the spacer opening 4 in FIG. 1, the photoresist 31 is used as a mask to remove a part of the $SiO_2$ spacer 15 by dry etching or wet etching with, e.g., buffered hydrofluoric acid.

Figure 3D:
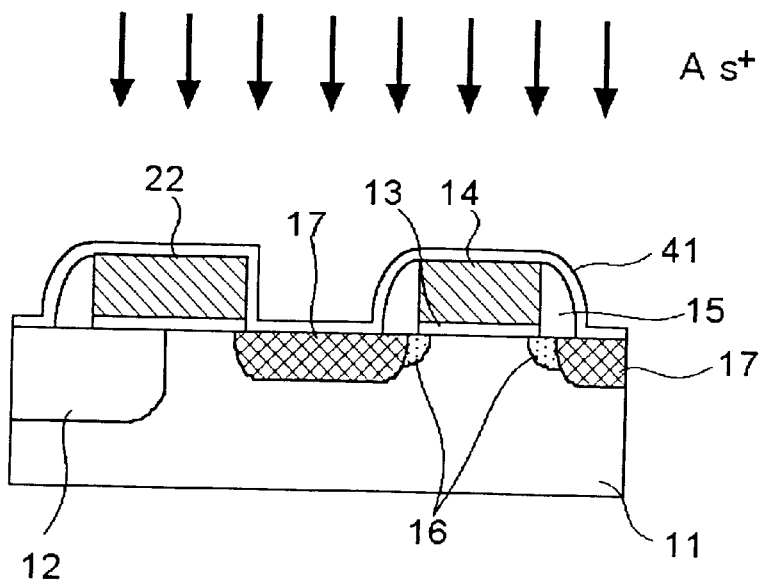

Then, as shown in FIG. 3(d), the photoresist is removed; a silicon oxide film 41 about 10 nm in thickness is deposited on the overall surface of the substrate; 3E15 of arsenic atoms are implanted with an energy of 40 keV on the overall surface; and then the substrate is annealed at 1000° C. for about 10 seconds to activate the doped layer (high-density doped layer) 17 and the LDD layer 16.

Figure 3E:
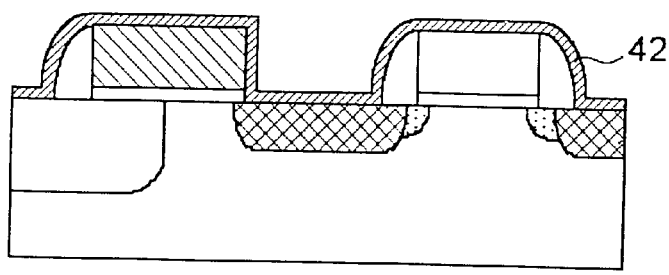

The silicon oxide film 41 is removed with, e.g., buffered hydrofluoric acid to expose the surfaces of the doped layer 17 as well as the surfaces of the gate electrodes 14 and 22, and then on the overall surface a titanium film 42 about 30 nm in thickness is deposited by, e.g., spattering (FIG. 3(e)).

Figure 3F:
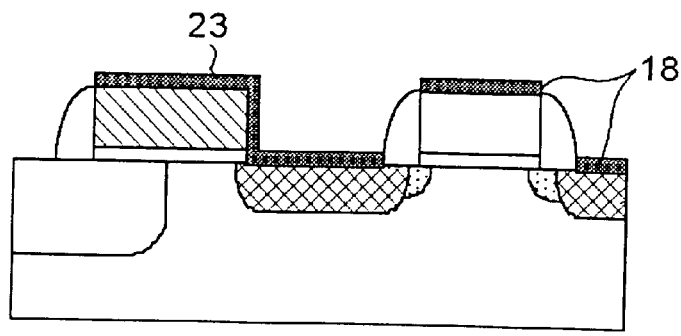

As shown in FIG. 3(f), a usual silicide technique is used to react the titanium film 42 with silicon for forming titanium silicide layers 18 and 23 on the surfaces of the doped layer 17 and of the gate electrodes 14 and 22 as well as on the exposed side of the gate electrode 22, and then the unreacted titanium is removed. During the process of the silicide reaction, the side of the gate electrode 23 and the doped layer 17 which are separated from each other with the silicon oxide film 21 of 5 nm thickness are connected via the titanium silicide layer 23.

EXAMPLE 2

In Example 1, when the active region shown in FIG. 1 is very narrow and the region 4 for opening the spacer covers an outer part of the active region 1 due to misalignment, the silicon oxide film within the device-isolation region may be also be etched during etching-back the silicon oxide film for removing the spacer. The following will describe an approach including a procedure to avoid this problem.

Figure 4:
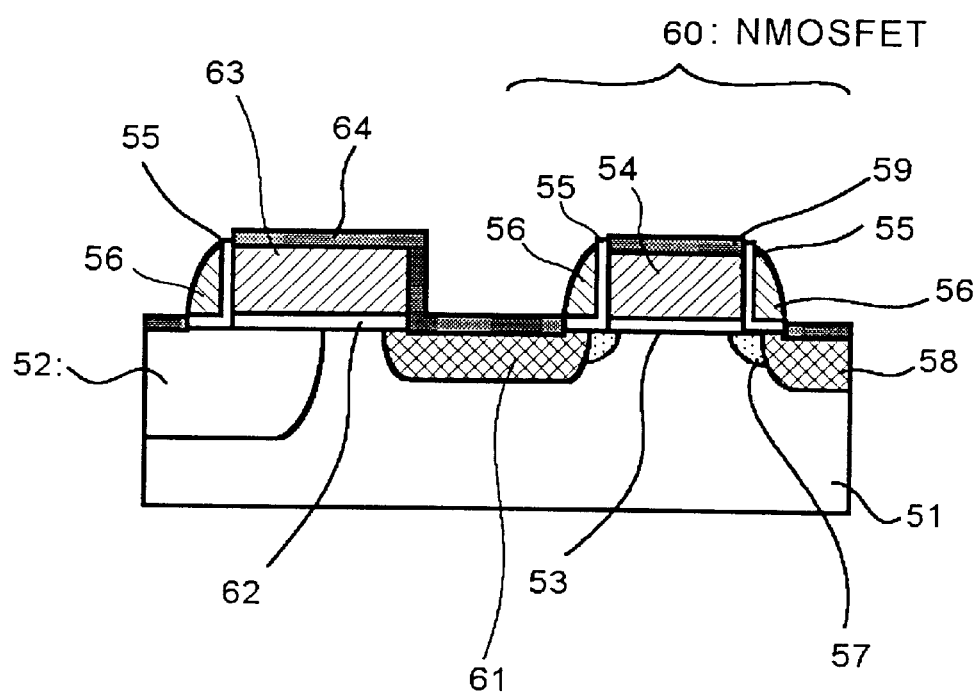
FIG. 4 is a schematic sectional view line X–X' in FIG. 1, showing the configuration of another embodiment of the semiconductor device of this invention.

FIG. 4 is a sectional view illustrating this example, whose plan view is similar to that of Example 1, and also showing a section along line X–X' in FIG. 1.

A gate electrode 54 consisting of polycrystalline silicon for forming a transistor via a gate oxide film 53 is formed on the surface of a silicon substrate 51 on which a device-isolation region 52 has been formed by a LOCOS or trench isolation technique. A spacer 56 consisting of silicon nitride film about 10 nm in thickness is formed in a manner that it is in contact with the side of a gate electrode 54 and the surface of the silicon substrate 51. A low-density doped layer 57 constituting an LDD transistor and a high-density doped layer 58 are formed in the region defined by the gate electrode 54 and the spacer 56 on the surface of the substrate. On the surfaces of the high-density doped layer 58 and the gate electrode 54, a cobalt silicide layer 59 is formed for minimizing resistance. These constitute an N-type MOSFET (60). An electrode 63 made of the same wiring material as that of the gate electrode is formed via a silicon oxide film 62 of the same material as that of the gate oxide film 53 on the silicon substrate 51 and the device-isolation region 52, for ensuring their electrical connection with a drain node 61 of MOSFET (60). Also, a cobalt silicide layer 64 is formed on the surface of the high-density doped layer as the drain node 61 as well as on the face and/or the side of the electrode 63, for electrically connecting these. In the above description, cobalt silicide is selected as a material of the silicide layer, but it is, of course, obvious that other silicides such as titanium silicide or other metal suicides may be used.

A manufacturing process for achieving the above configuration will be described with reference to FIGS. 5(a) to 5(i).

Figure 5A:
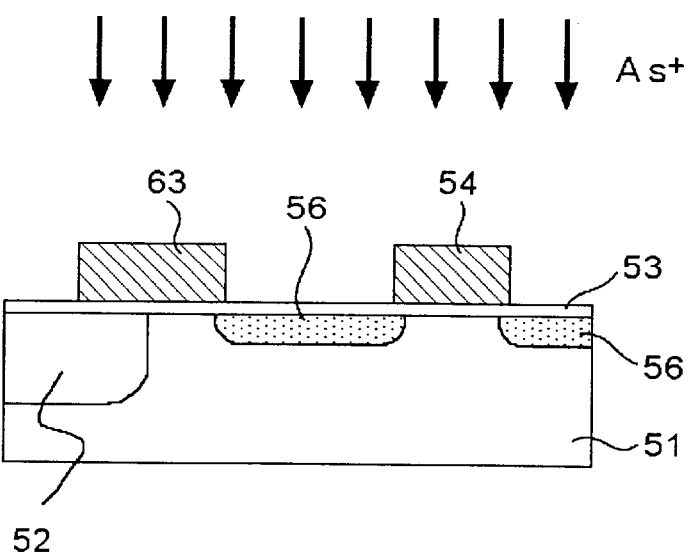
FIGS. 5(a) to 5(i) are sequential diagrams illustrating a manufacturing process of the semiconductor device in FIG. 4.

As shown in FIG. 5(a), a device-isolation region 52 is formed on a silicon substrate 51 doped with a P-type impurity by a LOCOS or trench isolation technique, in accordance with a usual manufacturing process for a MOSFET. On the surfaces of these elements, a material for a gate electrode, such as polycrystalline silicon 150 nm in thickness, is deposited via a gate oxide film 53, such as a silicon oxide film 5 nm in thickness, and it is subject to patterning in a desired shape to form gate electrodes 54 and 63. Then, the overall surface is implanted, for example, with 5E13 of arsenic atoms with an energy of 20 keV to form an LDD (low-density doped) layer 56.

Figure 5B:
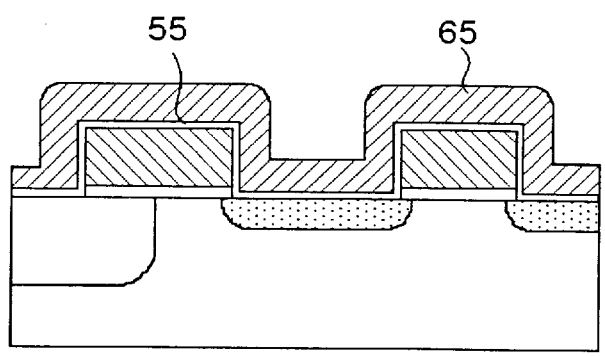

On the overall surface of the substrate on which the gate electrodes 54 and 63 have been formed is deposited a silicon oxide film 55 about 10 nm in thickness, and a silicon nitride film 65 about 100 nm in thickness (FIG. 5(b)). The silicon oxide film may be formed on the surfaces of the silicon substrate 51 as well as of the gate electrodes 54 and 63 by a thermal oxidation process instead of deposition of silicon oxide.

Figure 5C:
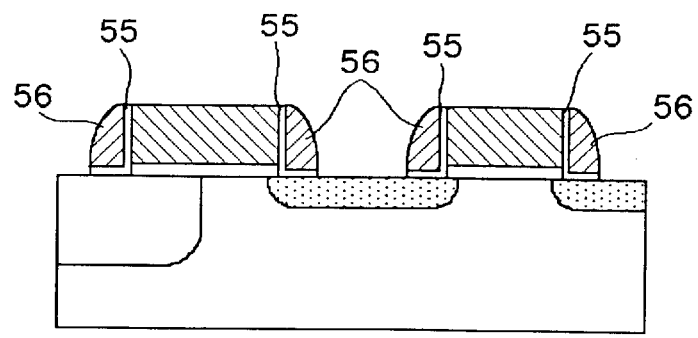

Then, the substrate is etched back by anisotropic dry etching to form $Si_3N_4$ spacers 56 on the sides of the gate electrodes 54 and 63 as shown in FIG. 5(c). Here, there are sandwiched silicon oxide films 55 between the side of the gate electrode 54 or 63 and the spacer 56, as well as between the spacer 56 and the silicon substrate 51, preventing crystal defects from generating in the substrate due to the difference of their coefficients of thermal expansion. In this example, silicon oxide films on the areas where a spacer is absent, i.e., the surfaces of the substrate except the upper faces of the gate electrodes 54 and 63 and the spacer areas, are removed at the same time, but they may be left without being etched.

Figure 5D:
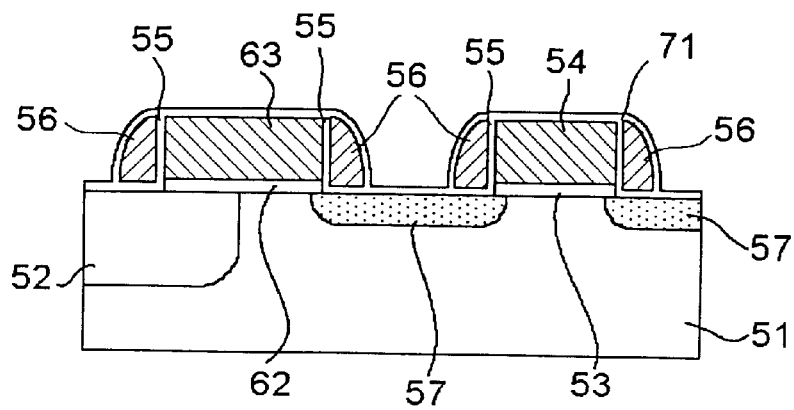
Figure 5E:
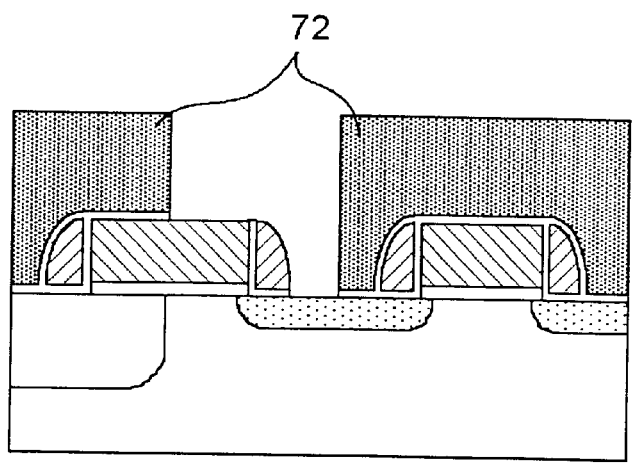

Then, a silicon oxide film 71 about 20 nm in thickness is deposited on the overall surface as shown in FIG. 5(d). After patterning a photoresist 72 as shown in FIG. 5(e) using a mask for forming the spacer opening 4 in FIG. 1, the photoresist 72 is used as a mask to remove a part of the above silicon oxide film 71 by dry etching or wet etching with, e.g., buffered hydrofluoric acid.

Figure 5F:
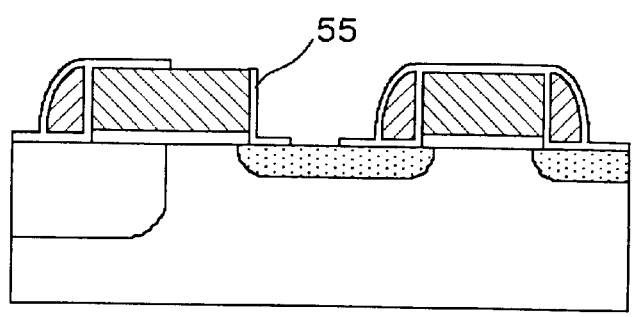

Then, as shown in FIG. 5(f), the photoresist 72 is removed, and the nitride film is etched by wet etching using phosphoric acid to remove the spacers 56 corresponding to the areas not covered by the silicon oxide film 71.

Figure 5G:
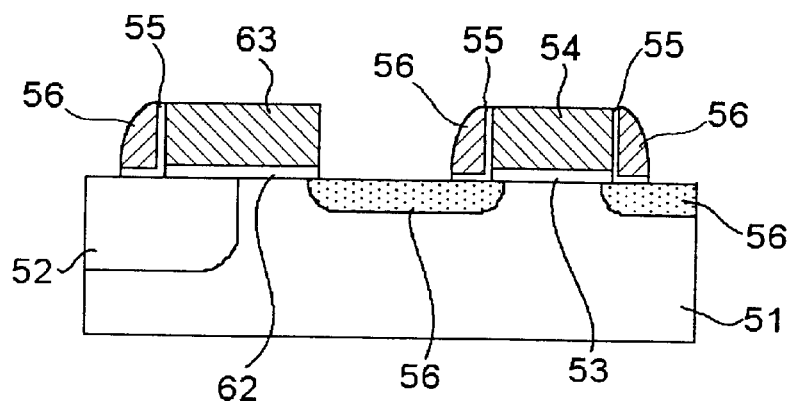

As shown in FIG. 5(g), the silicon oxide film 71 is removed in the exposed areas by wet etching using buffered hydrofluoric acid, where it is essential to prevent the silicon oxide films 55 formed between the spacer 56 and the substrate 51 as well as between the gate electrodes 54 and 63 from being excessively etched, by controlling an etching time.

Figure 5H:
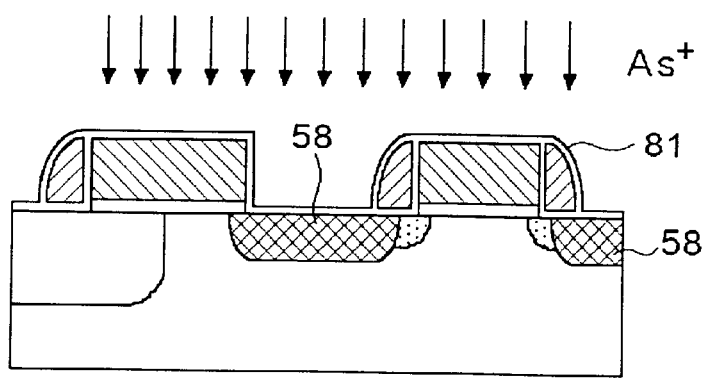

A silicon oxide film 81 about 10 nm in thickness is again deposited on the overall surface of the substrate; 3E15 of arsenic atoms are implanted with an energy of 40 keV on the overall surface; and then the substrate is annealed at 1000° C. for about 10 seconds to activate the doped layer (high-density doped layer) 58 and the LDD layer 56 (FIG. 5(h)).

Figure 5I:
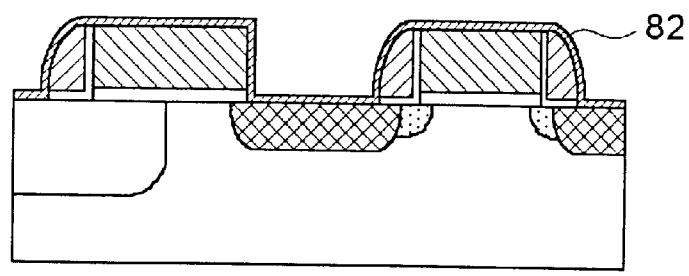

The silicon oxide film 81 is removed with, e.g., buffered hydrofluoric acid to expose the surfaces of the doped layer 58 as well as of the gate electrodes 54 and 63, and then on the overall surface is deposited a cobalt film 82 about 10 nm in thickness by, e.g., spattering as shown in FIG. 5(i).

Finally, a usual silicide technique is used to react the cobalt film 82 with silicon for forming cobalt silicide layers 59 and 64 on the surfaces of the doped layer 58 and of the gate electrodes 54 and 63, as well as on the exposed side of the gate electrode 63, and then unreacted cobalt is removed to provide the configuration shown in FIG. 4. During the process of the silicide reaction, the side of the gate electrode 64 and the doped layer 58 which are separated from each other with the gate oxide film 62 of 5 nm thickness are connected via the cobalt silicide layer 64.

EXAMPLE 3

A metal silicide layer alone may not give a suitable electric connection due to interruption of the silicide layer in the boundary area between a gate electrode and a doped layer, depending on the manufacturing conditions. The following description will illustrate an approach for solving this problem, using an example of forming an N-type MOSFET on a P-type substrate, whose process is shown in FIGS. 6(a) to 6(f).

1) First, a device-isolation region 102 is formed on a silicon substrate 101 in accordance with a usual process for manufacturing an LDD-MOSFET; the surface of the substrate is oxidized to form a gate $SiO_2$ film 103 of 6 nm thickness; then a gate electrode 104 consisting of polysilicon about 200 nm in thickness is formed. Next, about $5 \times 10^{13}$ of arsenide ions are implanted with an energy of about 20 keV to form an LDD layer 106. A non-doped $SiO_2$ film about 100 nm in thickness is formed on the overall surface by a CVD technique, and then all the surface is etched back to form an LDD spacer 107 on the sidewall of the gate electrode. About $2 \times 10^{15}$ of arsenide ions are implanted to form an N-type source-drain doped layer (FIG. 6(a)).

Figure 6A:
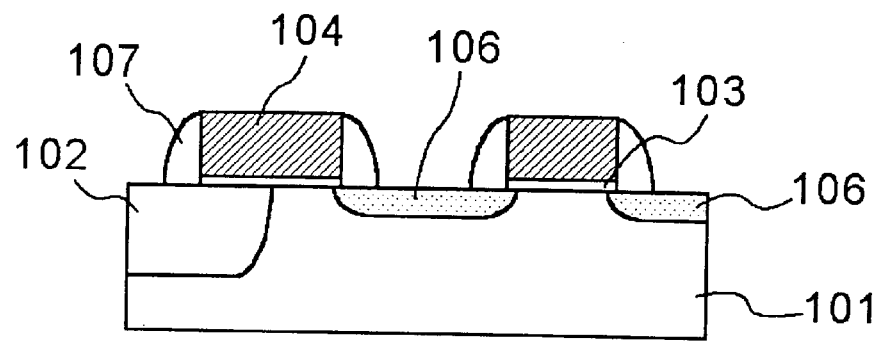
FIGS. 6(a) to 6(f) are sectional process charts illustrating Example 3.
Figure 6B:
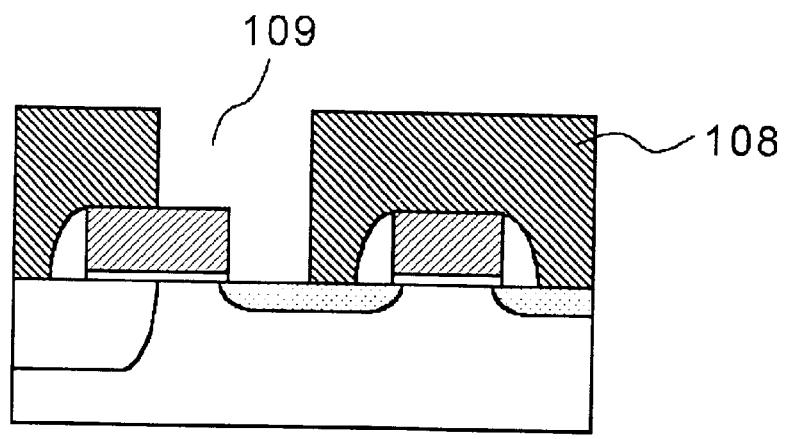

2) A photoresist 108 is patterned for removing a spacer including an area where a common contact is to be formed, and after masking an oxide film spacer 107 is removed in the area 109 where the common contact is to be formed by anisotropic plasma etching or wet etching using buffered hydrofluoric acid (FIG. 6(b)).

Figure 6C:
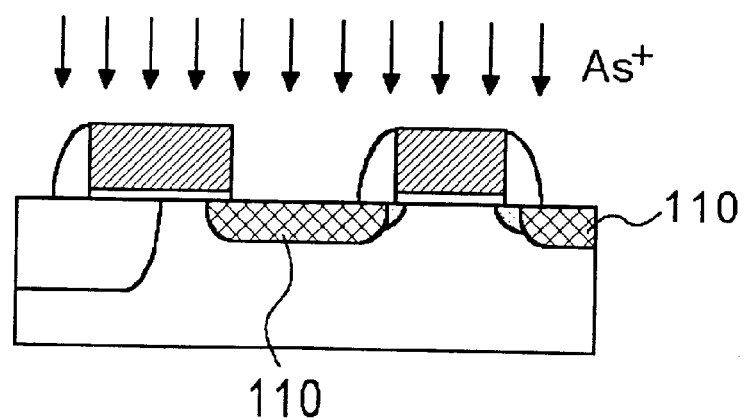
Figure 6D:
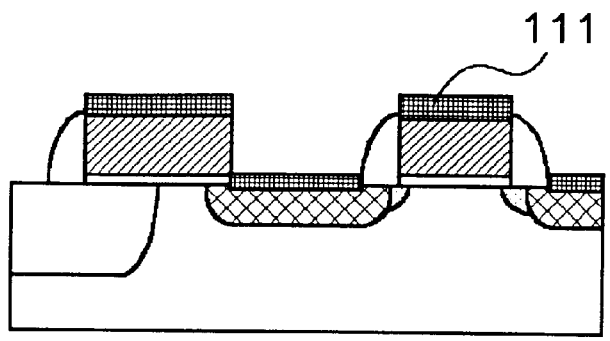
Figure 6E:
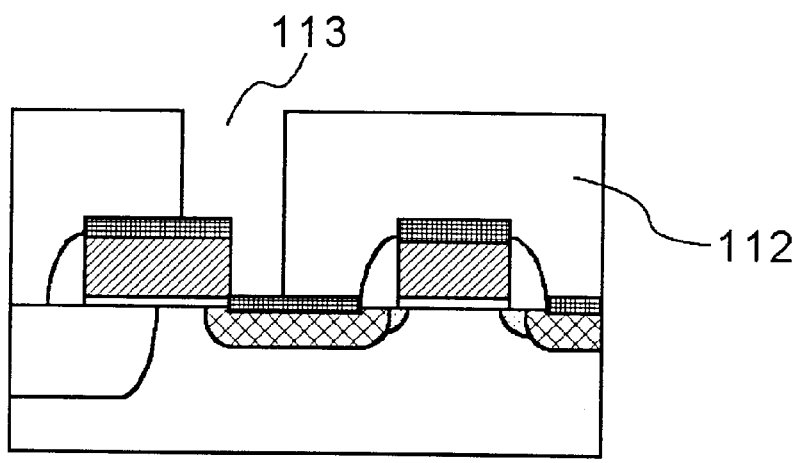
Figure 6F:
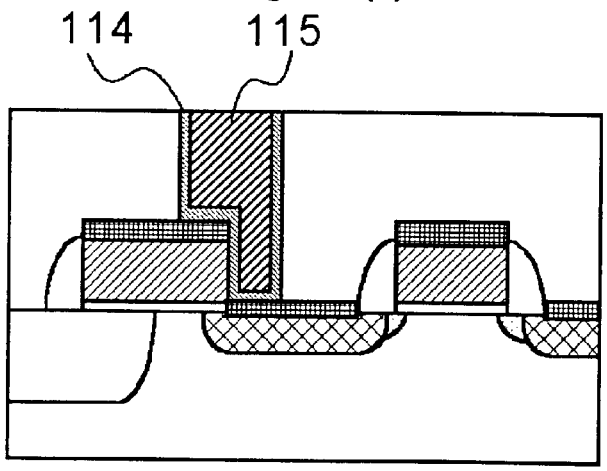

3) After removing the resist 108, about $2 \times 10^{15}$ of As ions are implanted with an energy of about 40 keV to form a high-density doped layer 110 constituting a source-drain of a transistor (FIG. 6(c)). It may be more preferable that an oxide film about 10 nm in thickness is formed by, e.g., a CVD technique for preventing generation of crystal defects in the substrate or channeling, before the above ion implantation. Furthermore, on the upper surfaces of the doped layer 110 and the gate electrode 104 a metal with a high melting point such as nickel and cobalt; is deposited, by, e.g., spattering, which is capable of reacting with silicon to form an alloy. Then, the substrate is heated to form a silicide layer 111 (FIG. 6(d)). Here, particularly when using a spattering technique, it is difficult to form a silicide layer on the side wall of the gate due to a poor step coverage. Furthermore, even if it is formed on the side wall, the gate electrode 104 and the doped layer 110 are apt to be electrically separated due to the presence of the gate oxide film.

Particularly when an anisotropy etching is used for removing the spacer, 5 to 20 nm of oxide film may be left on the side wall of the gate electrode 104, where the gate electrode 104 and the doped layer 110 may be electrically separated.

4) A non-doped $SiO_2$ film 112 about 100 nm in thickness is deposited by a CVD technique on the overall surface of the substrate including the transistor formed in the-above steps; a BPSG film 113 about 1000 nm in thickness is deposited by a CVD technique; and then the overall surface is made flat by a CMP technique. Then, the above usual contact is opened using a resist mask, and the BPSG film 113 and the non-doped $SiO_2$ film 112 are etched by anisotropic etching to form a contact hole 114 reaching the silicide layer 111 on the doped layer or the gate electrode (FIG. 6(e)).

5) In the contact hole 114 is formed a barrier metal layer 115 by depositing, on the overall surface, a titanium film about 30 nm in thickness and then a titanium nitride film about 100 nm in thickness, using a spattering technique. Next, tungsten is deposited on the overall surface by a CVD technique, which is then etched back to form a tungsten plug 116 buried in the contact hole 114, resulting in the configuration shown in FIG. 6(f).

Figure 8A:
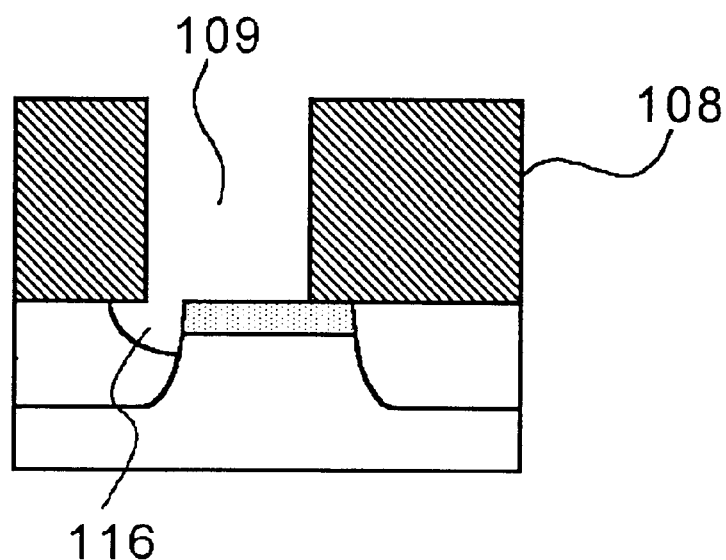
FIGS. 8a and 8b are cross sections along line Y–Y' in FIG. 7, illustrating isotropic and anisotropic etching of the device-isolation region, respectively.
Figure 8B:
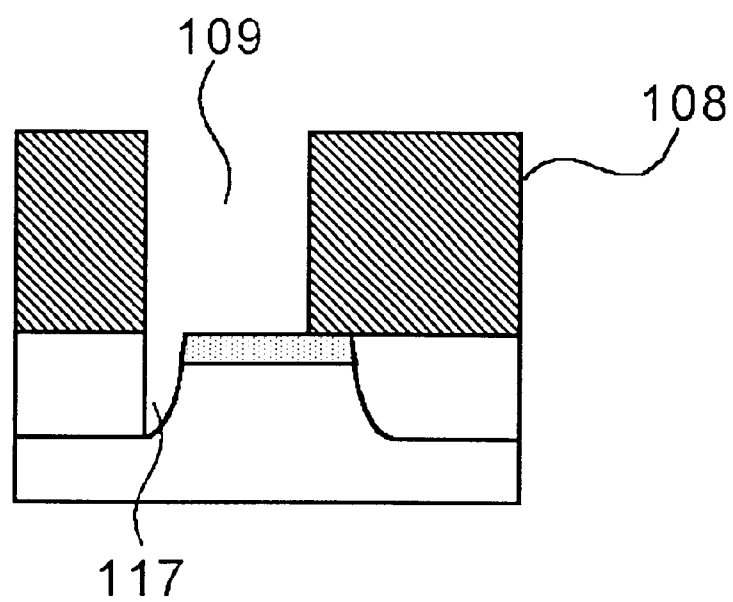
Figure 9A:
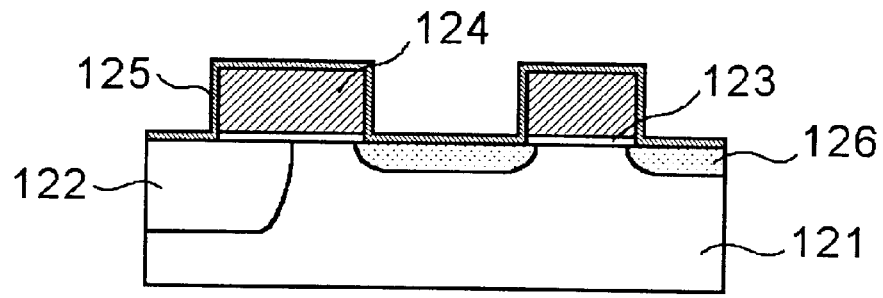
Figure 9B:
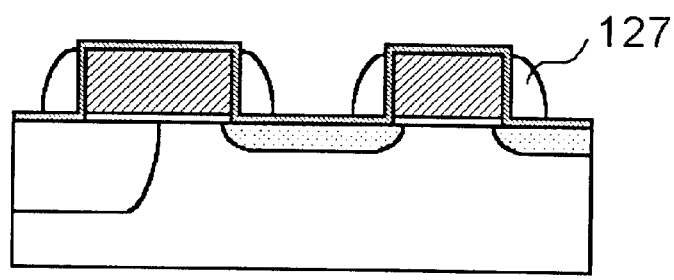
Figure 9C:
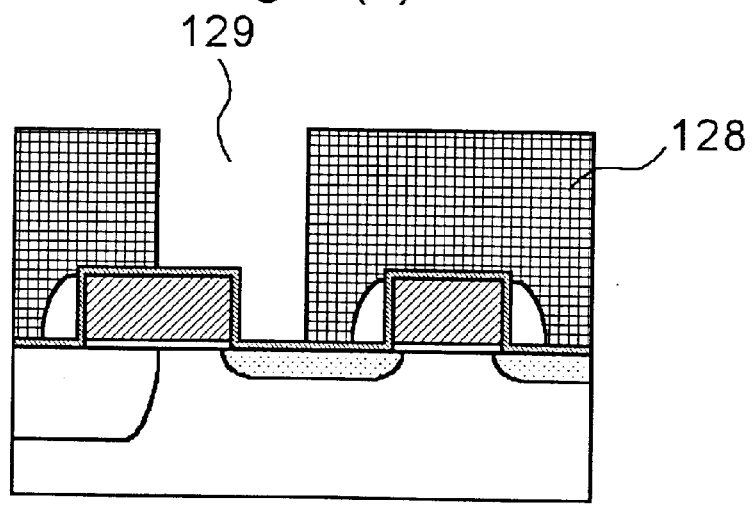
Figure 9D:
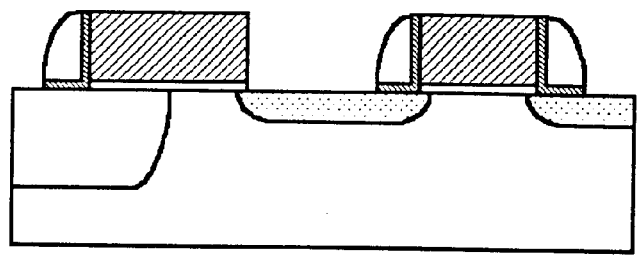
Figure 9E:
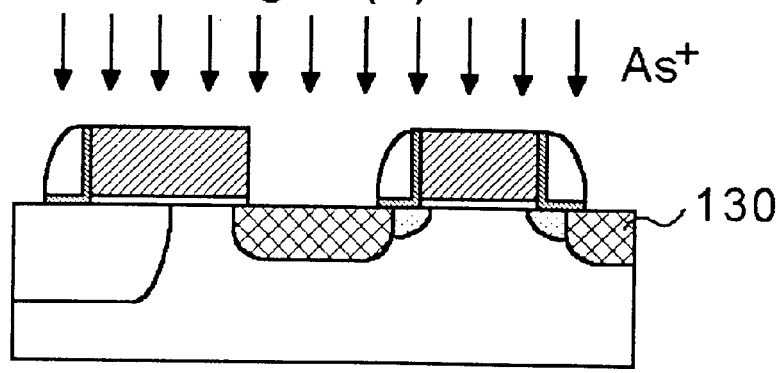
Figure 9F:
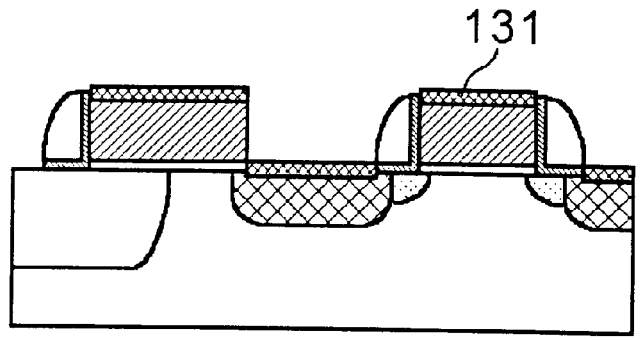
Figure 9G:
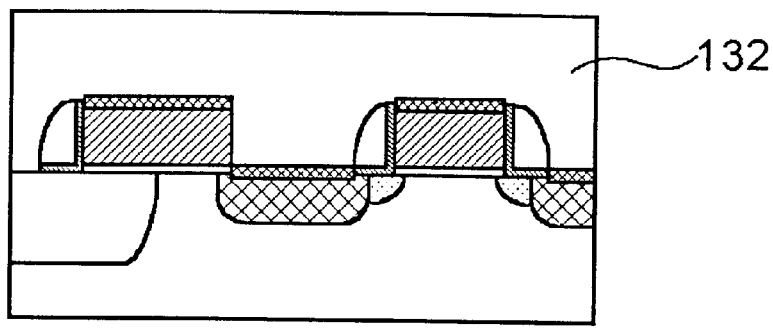
Figure 9H:
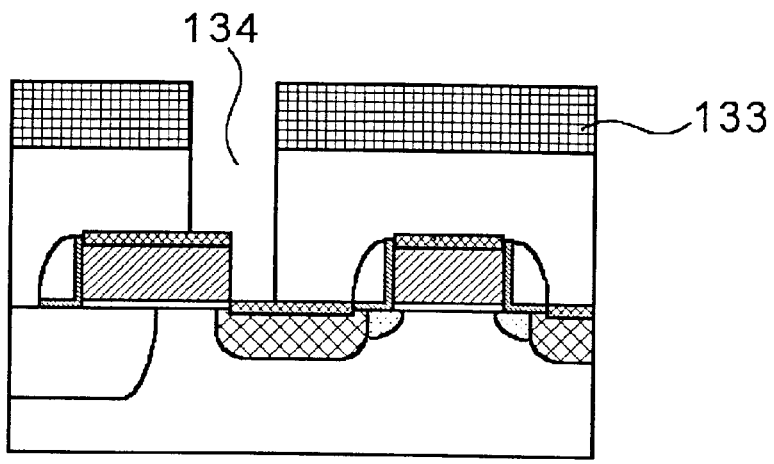
Figure 9I:
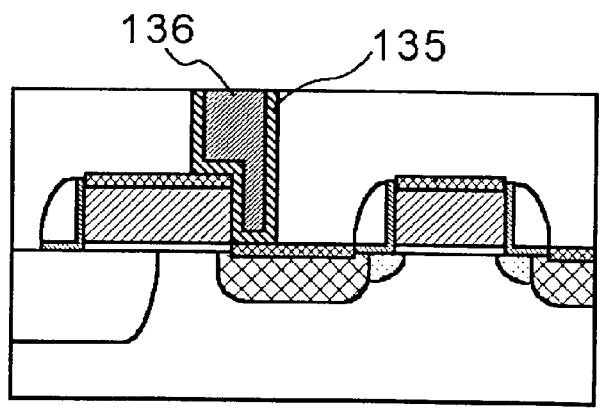

This process should be further improved. For example, when an extremely fine doped layer is required, as in an SRAM, a common contact hole 5 may cover a part of a device-isolation region beyond an active region 1 as shown in the plane view of FIG. 11. Thus, it may be, of course, expected that a mask 4 during removal of the spacer may cover part of the device-isolation region. In an etching process during removal of the spacer, it is necessary to conduct over-etching in 30 to 100% for achieving homogeneous removal over all the surface of the wafer. Therefore, an insulating film buried in the device-isolation region may be also etched as shown in FIGS. 8(*a*) and 8(*b*) in isotropic etching such as wet etching and in anisotropic etching, respectively. Here, FIGS. 8(*a*) and 8(*b*) show sectional views along line Y–Y' in FIG. 7. The narrow and deep slot (116, 117) may not be filled during deposition of an interlayer film whose step coverage is not adequate. Thus, it may be left until preparation of the final device, which may cause problems in quality. An example for achieving such an improvement will now be described.

EXAMPLE 4

The following is an example of forming an N-type MOSFET on a P-type substrate, which will be described with reference to the sectional process charts in FIGS. 9(*a*) to 9(*i*).

1) First, a device-isolation region 122 is formed on a silicon substrate 121 in accordance with a usual process for manufacturing an LDD-MOSFET; the surface of the substrate is oxidized to form a gate $SiO_2$ film 123 of 6 nm thickness; then a gate electrode 124 consisting of polysilicon about 200 nm in thickness is formed. Next, about $5 \times 10^{13}$ of As ions are implanted with an energy of about 20 keV to form an LDD layer 126. A non-doped $Si_3N_4$ film 125 about 20 nm in thickness is deposited on the overall surface by a low pressure CVD technique (FIG. 9(*a*)).

2) On the overall surface is deposited a non-doped $SiO_2$ film about 100 nm in thickness by a CVD technique, and the oxide film of the overall surface is etched back under the etching conditions exhibiting a selection ratio at least 3:1 of for the nitride film 125, to form an LDD spacer 107 on the side wall of the gate electrode (FIG. 9(*b*)).

3) A resist mask 128 is patterned for removing a spacer, including an area where a common contact is to be formed. Using the resist as a mask, the oxide film is etched by dry etching under the etching conditions exhibiting at least a selection ratio 3:1 of for the oxide film or by wet etching with, e.g., buffered hydrofluoric acid, to remove the exposed spacer in the area 109 where the common contact in the mask opening is to be formed (FIG. 9(*c*)).

4) After removing the resist mask 128, the exposed nitride film 125 is removed by dry etching or wet etching with, e.g., phosphoric acid (FIG. 9(*d*)).

5) About $2 \times 10^{15}$ of As ions are implanted with an energy of about 40 keV to form a high-density doped layer 130 constituting a source-drain of a transistor. It may be more preferable that an oxide film about 10 nm in thickness (not shown) is formed by, e.g., a CVD technique, for preventing generation of crystal defects in the substrate or channeling, before the above ion implantation. Furthermore, on the upper surfaces of the doped layer 130 and the gate electrode 124 a metal with a high melting point such as titanium and cobalt; is deposited, by, e.g., spattering, Then, the substrate is silicided by heating to form a silicide layer 131 (FIG. 9(*e*)). Here, particularly when using a spattering technique, it is difficult to form a silicide layer on the side wall of the gate due to a poor step coverage. Furthermore, even if it is formed on the side wall, the gate and the doped layer are apt to be electrically separated due to the presence of the gate oxide film.

6) As described in Example 3, a non-doped $siO_2$ film about 100 nm in thickness is deposited by a CVD technique on the overall surface of the substrate including the transistor formed in the above steps; a BPSG film 132 about 1000 nm in thickness is deposited by a CVD technique; and then the overall surface is made flat by a CMP technique. Then, the above usual contact is opened using a resist mask, and the BPSG film and the non-doped $SiO_2$ film are etched by anisotropic etching to form a contact hole reaching the doped layer or the gate electrode. In the contact hole is formed a barrier metal layer by depositing, on the overall surface, a titanium film about 30 nm in thickness and then a titanium nitride film about 100 nm in thickness, using a spattering technique. Then, tungsten is deposited on the overall surface by a CVD technique, which is then etched back to form a tungsten plug buried in the contact hole (FIG. 9(*f*)).

Then, an interlayer insulating film 132 is deposited as described in Example 3 (FIG. 9(*g*)); a contact hole 134 is formed at the predetermined site of the interlayer insulating film 132 using a photoresist 133 (FIG. 9(*h*)); and after removing the resist, a barrier film 135 and a contact plug 136 are buried to provide the semiconductor device shown in FIG. 9(*i*).

As is shown in FIGS. 9(*a*) to 9(*i*), even if the mask for removing the spacer covers a part of the device-isolation region, the nitride film 125 may act as a stopper, preventing the insulating film buried in the device-isolation region from being etched.

The above examples are constituted by an NMOSFET, although a PMOSFET or a CMOS as a combination of these may be used.

What is claimed is:

1. A semiconductor device comprising:
    a gate insulating film formed on a main surface of a silicon substrate having a deviceisolation region;
    a gate electrode comprising polycrystalline silicon;
    an LDD-MOSFET formed into the main surface of said silicon substrate along a first side of the gate electrode;
    a spacer formed on a second side of the gate electrode opposite the first side including said LDD-MOSFET;
    a high-density doped layer;
    a first metal silicide layer disposed on an upper surface of the gate electrode;
    a second metal silicide layer abutting the gate insulating film and disposed on an upper surface of the high-density doped layer to be in contact with the high-density doped layer along an entire length of a bottom segment of the second metal silicide layer;
    a common contact in physical contact with said first metal silicide layer and said second metal silicide layer for connecting both the gate electrode and the high-density doped layer to an upper wiring, wherein the gate electrode and the high-density doped layer are electrically connected to the upper wiring via the first and second metal silicide layers through a contact plug buried in the common contact, and
    wherein said common contact includes a metal barrier film disposed along peripheral edges of the common contact, wherein a bottom peripheral edge of the barrier film is in continuous contact with the second metal silicide layer.

2. A semiconductor device comprising:
    a gate insulating film formed on a main surface of a silicon substrate having a device-isolation region;
    a gate electrode;
    an LDD-MOSFET formed into the main surface of said silicon substrate along a first side of the gate electrode;

a spacer formed on a second side of the gate electrode opposite the first side including said LDD-MOSFET;

a high-density doped layer; and a metal silicide layer having a first segment formed on an upper surface of the gate electrode and a second segment formed in physical contact with said high-density doped layer, said second segment of the metal silicide layer having a bottom-most segment in continuous contact with the high-density doped layer along an entire length of said bottom-most segment;

further comprising a common contact connecting both the gate electrode and the high-density doped layer to an upper wiring through a contact plug buried in the common contact, wherein the common contact is physically connected to said metal silicide layer along the first segment of the metal silicide layer which is opposite to the upper surface of the gate electrode, wherein the common contact is in physical contact with the gate electrode along a vertical surface of the first side of the gate electrode, and wherein the common contact is in physical contact along the second segment of the metal silicide layer which is disposed opposite to the high density doped layer;

wherein said common contact includes a metal barrier film disposed along peripheral edges of the common contact, wherein a bottom peripheral edge of the barrier film is in continuous contact with the second segment of the metal silicide layer disposed opposite to the high density doped layer.

* * * * *